(12) United States Patent
Bhalerao et al.

(10) Patent No.: US 9,983,920 B2
(45) Date of Patent: *May 29, 2018

(54) SYSTEM, METHOD AND APPARATUS FOR PREVENTING DATA LOSS DUE TO MEMORY DEFECTS USING LATCHES

(71) Applicant: SanDisk Technologies Inc., Plano, TX (US)

(72) Inventors: Abhijeet Bhalerao, San Jose, CA (US); Mrinal Kochar, San Jose, CA (US); Aaron Lee, Milpitas, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 16 days.

This patent is subject to a terminal disclaimer.

(21) Appl. No.: 15/150,325

(22) Filed: May 9, 2016

(65) Prior Publication Data
US 2016/0253231 A1    Sep. 1, 2016

Related U.S. Application Data

(63) Continuation of application No. 14/300,155, filed on Jun. 9, 2014, now Pat. No. 9,372,629.

(51) Int. Cl.
*G06F 11/00*    (2006.01)
*G06F 11/07*    (2006.01)
(Continued)

(52) U.S. Cl.
CPC .......... *G06F 11/079* (2013.01); *G06F 3/0619* (2013.01); *G06F 3/0647* (2013.01); *G06F 3/0653* (2013.01); *G06F 3/0659* (2013.01); *G06F 3/0673* (2013.01); *G06F 3/0685* (2013.01); *G06F 11/00* (2013.01); *G06F 11/073* (2013.01); *G06F 11/0727* (2013.01);
(Continued)

(58) Field of Classification Search
USPC ......................................................... 714/6.1
See application file for complete search history.

(56) References Cited

U.S. PATENT DOCUMENTS 8,473,923 B2 *   6/2013   Lin ..................... G06F 11/1441
                                                            711/103
9,372,629 B2     7/2016   Bhalerao et al.
(Continued)

OTHER PUBLICATIONS

U.S. Appl. No. 14/300,155 Notice of Allowance dated Feb. 12, 2016.

*Primary Examiner* — Sarai E Butler
(74) *Attorney, Agent, or Firm* — Kunzler, PC

(57) ABSTRACT

A system and method for operating a memory system includes receiving a first user data, writing the first user data to a first buffer, writing the first user data from the first buffer to a first selected memory location, writing the first user data from the first buffer into a second buffer when the first user data was successfully written to the first selected memory location. Data is retrieved from the first selected memory location and written into the first buffer. Data in the first buffer can be matched to the user data in the second buffer to confirm a successful storage of the first user data in the memory system. A previously stored user data can be retrieved from a third selected memory location and written into a third buffer when the previously stored user data was stored in the memory system before the first user data.

23 Claims, 7 Drawing Sheets

(51) Int. Cl.
*G06F 3/06* (2006.01)
*G11C 29/02* (2006.01)
*G11C 29/04* (2006.01)
*G11C 29/42* (2006.01)
*G11C 29/00* (2006.01)

(52) U.S. Cl.
CPC ...... *G06F 11/0751* (2013.01); *G06F 11/0793* (2013.01); *G11C 29/025* (2013.01); *G11C 29/04* (2013.01); *G11C 29/42* (2013.01); *G11C 29/76* (2013.01); *G06F 11/004* (2013.01); *G11C 2029/0409* (2013.01)

(56) References Cited

U.S. PATENT DOCUMENTS

| | | | | |
|---|---|---|---|---|
| 2005/0193233 A1* | 9/2005 | Magliocco | ............ | G11C 29/56 714/5.1 |
| 2010/0318840 A1* | 12/2010 | Tsai | ............ | G06F 11/141 714/5.11 |

* cited by examiner

SYSTEM, METHOD AND APPARATUS FOR PREVENTING DATA LOSS DUE TO MEMORY DEFECTS USING LATCHES

CROSS REFERENCE TO RELATED APPLICATIONS

This application is a continuation of and claims priority from U.S. patent application Ser. No. 14/300,155 filed on Jun. 9, 2014 and entitled "System, Method and Apparatus for Preventing Data Loss Due to Memory Defects Using Latches," which is incorporated herein by reference in its entirety.

BACKGROUND

The present invention relates generally to memory systems, and more particularly, to methods and systems for using and testing the integrity of memory systems.

Solid state memory systems are manufactured in great volume and in many different forms including volatile type memory circuits and non-volatile type memory circuits. As part of the production process the completed memory circuits are tested to confirm the proper operation of the memory. Specifically, the completed memory circuits are tested to confirm the memory circuit can be written to and the data that was written (i.e., stored) in the memory circuit can accurately be read back from the memory circuit. Typically, a high voltage write and erase cycles and read operations are applied to the memory circuit. The higher voltage of the operations physically stress the semiconductor devices (e.g., gates, P-N junctions, conductive lines, etc.) greater than typical operating voltage so as to cause physically weaker semiconductor devices to fail.

There are many types of tests performed as part of the manufacturing process. These manufacturing process tests can reliably only identify memory circuits that fail due to manufacturing defects or fail during early operations, often referred to as infant mortality, occurring in an early portion of the projected service life of the memory circuit.

The memory circuits that pass the manufacturing process tests are then shipped to end users and distributors. Unfortunately, many memory circuits can fail later in the projected service life, well after the memory circuits successfully passed the manufacturing process tests. When memory circuits fail, the data stored therein can be lost, corrupted or otherwise rendered not accessible and effectively lost.

In view of the foregoing, there is a need for system and method for preventing data loss due to memory cell failure.

SUMMARY

Broadly speaking, the present invention fills these needs by providing systems and methods for preventing data loss due to memory cell failure. It should be appreciated that the present invention can be implemented in numerous ways, including as a process, an apparatus, a system, computer readable media, or a device. Several inventive embodiments of the present invention are described below.

One embodiment provides a method for operating a memory system including receiving a first quantity of user data (DATAn), writing the first quantity of user data (DATAn) to a first buffer, writing the first quantity of user data (DATAn) from the first buffer to a first selected memory location (WLn) in a first selected memory block, writing the first quantity of user data (DATAn) from the first buffer into a second buffer when the first quantity of user data (DATAn) was successfully written to the first selected memory location (WLn) of the first selected memory block. A quantity of stored data (DATAn') can be retrieved from the first selected memory location and the retrieved quantity of stored data (DATAn') can be written into the first buffer. The quantity of stored data in the first buffer (DATAn') can be matched to the first quantity of user data (DATAn) in the second buffer to confirm a successful storage of the first quantity of user data, in the memory system.

The method can also include writing the first quantity of user data (DATAn) from the first buffer into a second selected memory location WLn of a second selected memory block in the memory system when the first quantity of user data (DATAn) was not successfully written to the first selected memory location. The method can also include writing a second quantity of user data (DATAn−1) to a third selected memory location in the memory system when the second quantity of user data (DATAn−1) is stored in a third buffer of the memory system.

The third selected memory location can be adjacent to the second selected memory location. The third selected memory location can precede the second selected memory location in the memory system. The second selected memory location can be included in a dedicated error handling memory block in the memory system. The dedicated error handling memory block can be included in the memory array or maintained separately from the memory array.

Receiving the first quantity of user data (DATAn) to be stored in the memory system can also include retrieving a quantity of previously stored user data (DATAn−1) in a third selected memory location and writing the retrieved quantity of previously stored user data (DATAn−1) into the third buffer when the previously stored user data (DATAn−1) was stored in the memory system before the first quantity of user data (DATAn). Writing the retrieved quantity of previously stored user data (DATAn−1) into the third buffer can include writing the retrieved quantity of previously stored user data (DATAn−1) into the first buffer, before writing the first quantity of user data (DATAn) to the first buffer and writing the retrieved quantity of previously stored user data (DATAn−1) from the first buffer into the third buffer.

The method can also include writing the first quantity of user data (DATAn) from the second buffer into the second selected memory location in the memory system when the quantity of stored data (DATAn') in the first buffer does not match the first quantity of user data (DATAn) in the second buffer. A second quantity of user data (DATAn−1) can be written to the third selected memory location in the memory system when the second quantity of user data (DATAn−1) is stored in a third buffer of the memory system.

The method can also include reporting a detected memory failure. Reporting the detected memory failure can include identifying the memory location of the memory failure.

Another embodiment provides a method for operating a memory system including writing a second quantity of user data (DATAn−1) into a third buffer of the memory system, receiving a first quantity of user data (DATAn) to be stored, the second quantity of user data (DATAn−1) preceding the first quantity of user data (DATAn). The first quantity of user data (DATAn) is written to a first buffer. The first quantity of user data (DATAn) is also written from the first buffer to a first selected memory location (WLn) in a first selected memory block. The first quantity of user data (DATAn) is written from the first buffer into a second buffer of the memory system when the first quantity of user data (DATAn) was successfully written to the first selected memory location. A quantity of stored data (DATAn') in the first selected memory location is retrieved and written into the first buffer. The quantity of stored data (DATAn') in the first buffer is confirmed to match the first quantity of user data (DATAn) in the second buffer. When the first quantity of user data (DATAn) was not successfully written to the first selected memory location, the first quantity of user data (DATAn) is written from the first buffer into a second selected memory location (WLn) in a second selected memory block in the memory system and the second quantity of user data is written to a third selected memory location (WLn−1) in the second selected memory block in the memory system, wherein the second selected memory location and the third memory location are included in a separate memory block from the first selected memory location.

Another embodiment provides a memory system including a memory array of multiple memory blocks of memory storage locations, a memory controller coupled to the memory array and a memory operating system logic. The memory operating system logic includes computer readable instructions on computer readable media for receiving a first quantity of user data (DATAn), writing the first quantity of user data (DATAn) to a first buffer and also writing the first quantity of user data (DATAn) from the first buffer to a first selected memory location (WLn) of a first selected memory block, writing the first quantity of user data (DATAn) from the first buffer into a second buffer when the first quantity of user data (DATAn) was successfully written to the first selected memory location (WLn), retrieving a quantity of stored data (DATAn') in the first selected memory location and writing the retrieved quantity of stored data (DATAn') into the first buffer. Confirming the quantity of stored data (DATAn') in the first buffer matches the first quantity of user data (DATAn) in the second buffer.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Several exemplary embodiments for systems and methods for preventing data loss due to memory cell failure will now be described. It will be apparent to those skilled in the art that the present invention may be practiced without some or all of the specific details set forth herein.

Memory circuit defects such as a broken (i.e., open) wordline(s) and weak or shorted control gate can corrupt the data during the write process without providing a timely fail status. Other defects such as wordline to wordline shorts can also corrupt data from the preceding wordline(s). When the host attempts to read wordlines with such defects, an uncorrectable error correction code (UECC error) is often received. Unfortunately, in many instances the data may not be recoverable by the time the UECC error is received by the host. As a result, data can be lost.

One solution includes storing data for wordline(s) n (currently written data) and for wordline(s) n−1 in latches or buffers. The data for wordline(s) n and for wordline(s) n−1 can be recovered if a UECC error or other defect is encountered. Before current data wordline (WLn) is written to a memory block, the data from previous wordline (WLn−1) is read into a buffer or other latch circuit such as a transfer latch and then transferred to an unused buffer or latch circuit. The current data for WLn is written to the memory block and also transferred to another unused buffer or latch circuit. At the end of the write operation, the data is located as follows:

WLn—Written to memory block
WLn—Copy available in first buffer or latch
WLn−1—Copy available in second buffer or latch WLn is read from the memory block for an error check such as a check bit or other error detection process. If the error check passes, the write is finalized and next command is processed. If the error check is failed, the good data is still available in the first and second buffers/latches for WLn and WLn−1, respectively, and can be recovered by copying the data from the first and second buffers/latches to a new memory block. A dedicated error handling memory block can be referred to as a safe zone memory block and can be set aside for handling memory failures. The dedicated error handling memory block can be included in the memory array or maintained separate from the memory array. The above process and system allows the memory system to be more tolerant of memory cell circuit defects such as broken wordlines, wordline to wordline shorts and a weak control gate.

As a result, the memory system can handle memory cell defects and yields a more robust and more reliable memory system and ensure integrity of the data stored in the memory. The above systems and methods also provide improved handling of fallouts and also provides the ability to reclaim memories and safely and accurately recover data stored in failed memory cells.

Figure 1:
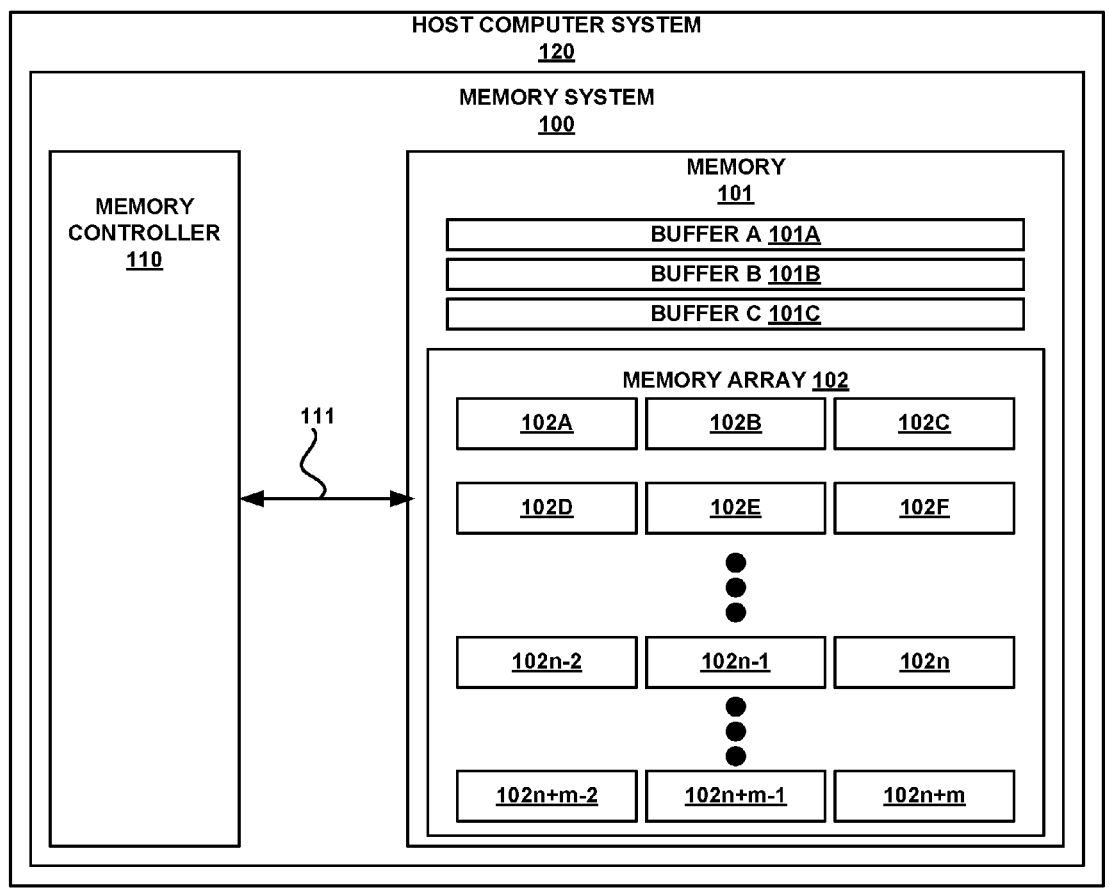
FIG. 1 is a block diagram of a memory system, for implementing embodiments of the present disclosure.

FIG. 1 is a block diagram of a memory system 100, for implementing embodiments of the present disclosure. The memory system 100 is coupled to or included as part of a host computer system 120. The memory system 100 includes one or more memory integrated circuits 101. The memory integrated circuits 101 include a memory array 102. The memory array 102 includes many memory cells arranged in logical blocks 102A-n+m of memory cells (e.g., memory blocks 102A-n+m). The memory integrated circuits 101 can also include buffer or latch circuits A-C, 101A-101C.

The memory system 100 also includes a memory controller 110. The memory controller 110 is coupled to one or more memory integrated circuits 101 by a bus 111. The memory controller 110 can include circuits for controlling the memory system 100 such as a memory control unit, a processor, buffers, memory operating system logic and other memory controller logic. The memory operating system logic can alternatively or additionally be included in the memory array 102.

The memory blocks 102A-n+m can include nonvolatile memory (NVM) such as flash memory (e.g., NAND flash) and other types of memory such as NOR, ORNAND, 3D memory and charge trapping memory with material such as silicon nitride, and phase change memory such as ReRAM, and semi-volatile memory such as DRAM and SRAM. The memory blocks 102A-n+m can also include volatile type memory circuits. The volatile type memory circuits can include, as an example, dynamic random access memory (DRAM) and static random access (SRAM) memory circuits.

The reliability of the user data storage in the memory blocks can be improved using the principles disclosed below for any type of memory that includes a memory cell, an accessing wordline and an accessing bitline. While the following examples discuss using a wordlines, similar processes can be applied to bitlines instead of or in addition to the wordline processes.

Figure 2:
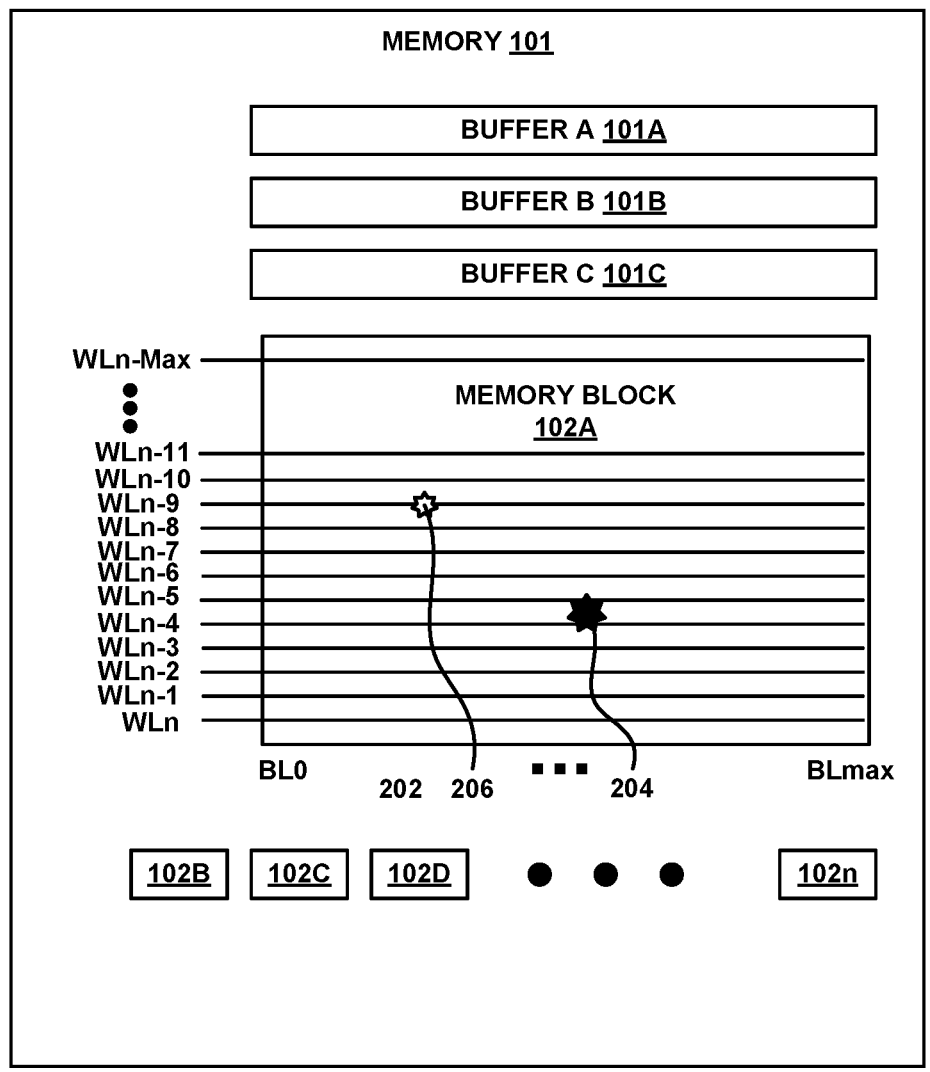
FIG. 2 is a simplified block diagram of a memory block, for implementing embodiments of the present disclosure.

FIG. 2 is a simplified block diagram of a memory block 102A, for implementing embodiments of the present disclosure. Each of the memory blocks 102A-n+m undergo write and erase cycles and read accesses. The memory blocks 102A-n+m can suffer device failures as the cycling/access counts increase. Typical failure modes in a memory block can include but are not limited to:

A wordline to wordline short;
Broken (open) wordlines;

A wordline to wordline short 204 is shown in FIG. 2. The wordline to wordline short 204 typically occurs due to an arc through an insulator electrically separating the wordlines WL4 and WL5 and thus allowing the two wordlines to have the same voltage during operations. This leads to writing the same data to the memory cells coupled to both wordlines WL4 and WL5.

A break or open 206 in wordline WL9 is shown in FIG. 2. The open 206 in wordline WL9 is typically caused by a failure in the conductor that forms wordline WL9 such as caused by heat, voltage or current stresses. The open 206 in the wordline WL9 prevents wordline WL9 from accessing the memory cells further to the right of the open 206.

Figure 3:
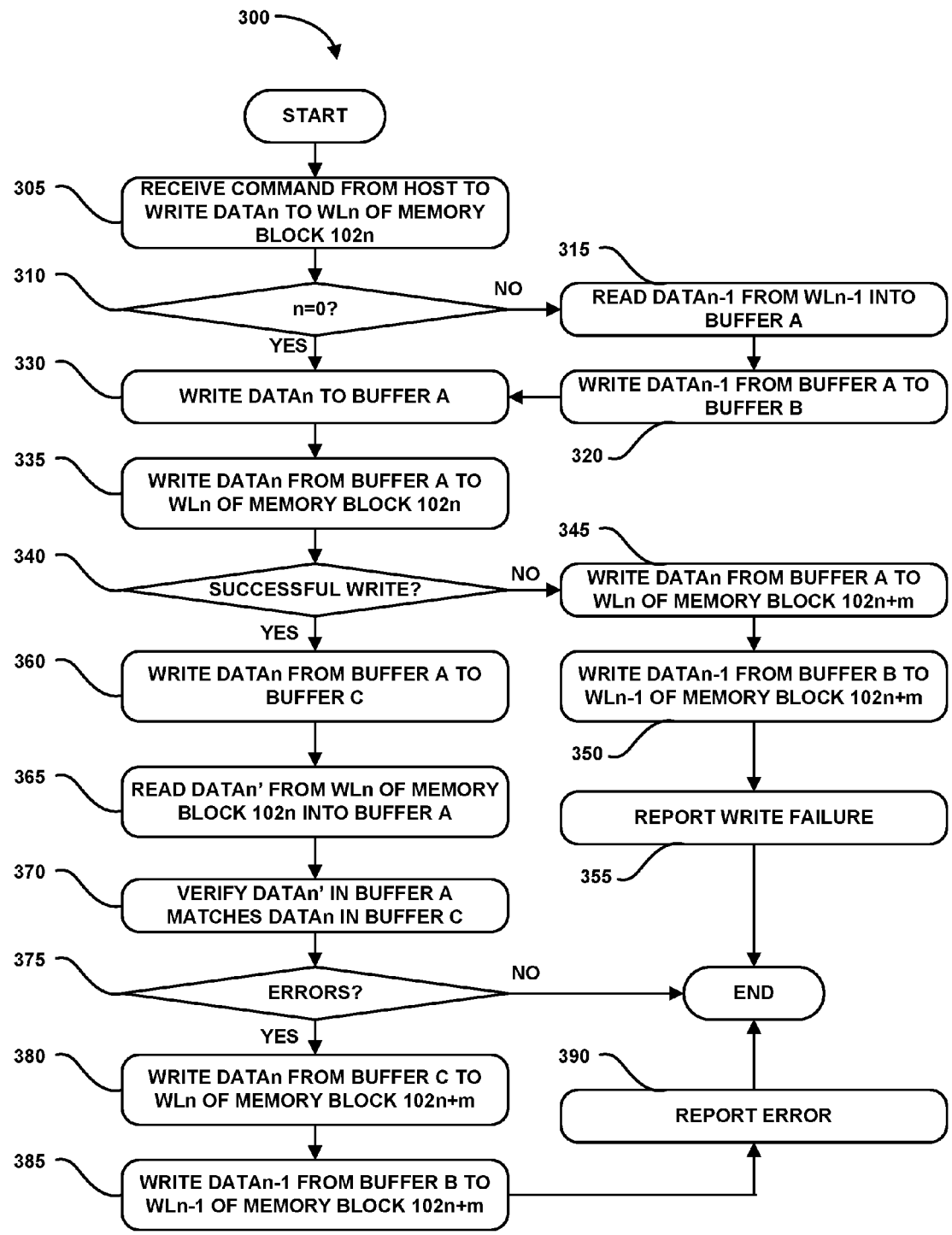
FIG. 3 is a flowchart diagram that illustrates the method operations performed in for preventing data loss due to memory cell failure in a selected memory block, for implementing embodiments of the present disclosure.

FIG. 3 is a flowchart diagram that illustrates the method operations 300 performed in for preventing data loss due to memory cell failure in a selected memory block, for implementing embodiments of the present disclosure. In an operation 305, a command is received from the host computer system 120 to write a quantity of user data (DATAn) to a selected memory block 102n. In operation 310, if n is equal to 0 then the received write command is the first write command and no previous user data was stored in the memory system 100. If n is equal to 0, the method operations continue in an operation 330 as described below.

If n is not equal to 0 in operation 310, then the received write command is not the first write command and there were at least one previous quantity of user data (DATAn−1) stored in the memory system 100. If n is not equal to 0 in operation 310, then the method operations continue in an operation 315.

In operation 315, the previously stored quantity of user data, DATAn−1 is read from the previous wordline(s), WLn−1, in the selected memory block 102n and written into a first buffer 101A. In an operation 320, the DATAn−1 is read from the first buffer 101A and into a second buffer 101B.

Figure 4A:
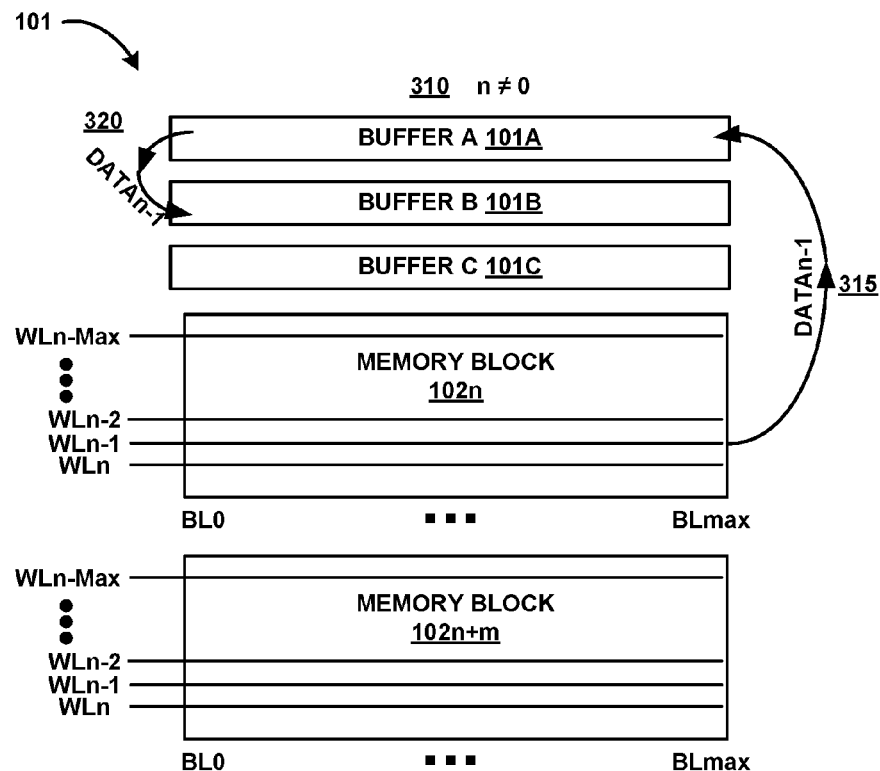
FIG. 4A illustrates the movement of DATAn−1 in operations 315 and 320, for implementing embodiments of the present disclosure.

FIG. 4A illustrates the movement of DATAn−1 in operations 315 and 320, for implementing embodiments of the present disclosure. User data DATAn−1 was previously stored in the memory block 102n, before the user data DATAn was received in operation 305. User data DATAn−1 was previously stored in a preceding location WLn−1 in the memory block 102n. User data DATAn−1 is read from the location WLn−1 in the memory block 102n and written into the first buffer 101A. The user data DATAn−1 is read from the first buffer 101A and written into the second buffer 101B.

While the examples described herein discuss single wordlines and quantities of data read from and written to single wordlines and the buffers 101A-C, it should be understood that a quantity of data spanning more than one wordline can be read from and written to the buffers 101A-C in substantially similar fashion. A capacity of the buffer 101A-C determines how much user data can be processed. A larger capacity buffer 101A-C can process more user data than a smaller capacity buffer. It should also be understood that each of the buffers 101A-C can be included in a single buffer and that each of the buffers 101A-C can include more than one buffer.

In operation 330, the received data, DATAn is written into the first buffer 101A. In an operation 335, the DATAn is read from the first buffer 101A and written into a selected wordline WLn of the selected memory block 102n.

Figure 4B:
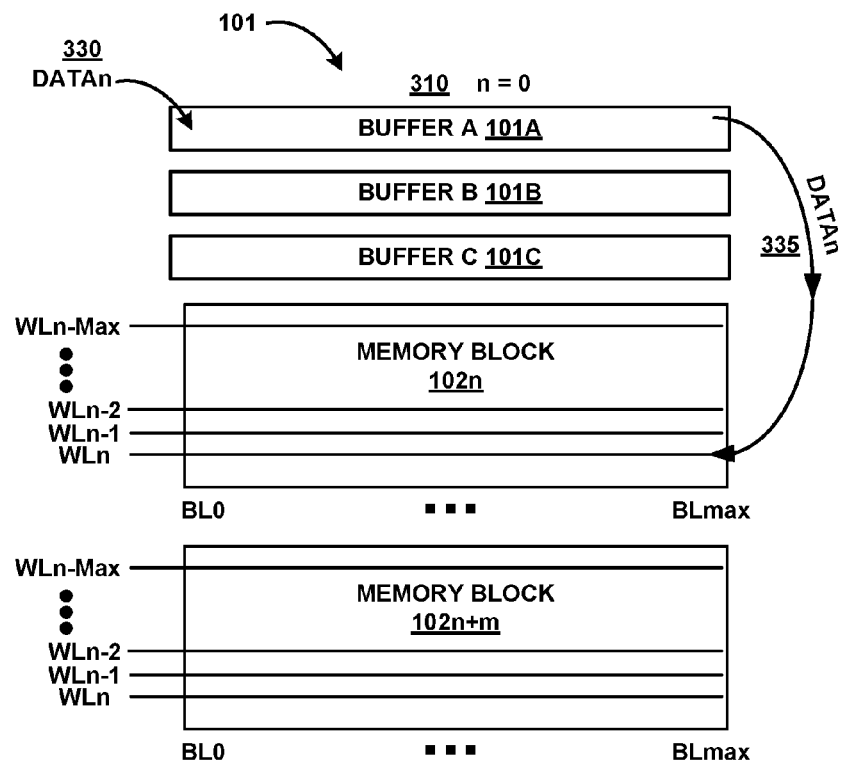
FIG. 4B illustrates the movement of DATAn in operations 330 and 335, for implementing embodiments of the present disclosure.

FIG. 4B illustrates the movement of DATAn in operations 330 and 335, for implementing embodiments of the present disclosure. The user data DATAn is initially written into the first buffer 101A when received in the memory system 100. The user data DATAn is then written into the selected memory location WLn of the selected memory block 102n.

In an operation 340, the write operation is examined to determine if the write operation was successful. There are many ways well known in the art to determine if the write operation is successful. By way of example: a check bit/count can be used or all or a portion of DATAn' stored in WLn can be read and compared to the corresponding portion of DATAn in the first buffer 101A. An unsuccessful write operation is indicated if the DATAn in the first buffer 101A was not accurately written to the WLn of the selected memory block 102n. Conversely, a successful write operation is indicated if the DATAn in the first buffer 101A was accurately written to the WLn of the selected memory block 102n. If, in operation 340, the write operation was successful, the method operations continue in an operation 360 described below.

If, in operation 340, the write operation was not successful, the method operations continue in an operation 345. The DATAn in the first buffer 101A is written to WLn of another selected memory block such as memory block 102n+m in operation 345. The value m can be equal to some value sufficient to indicate another memory block. It should also be understood that 102n+m could also indicate a different portion of the same memory block 102n. By way of example, different wordlines other than WLn, WLn−1 within memory block 102n can be indicated by memory block 102n+m.

In one implementation, the another selected memory block 102n+m can be a dedicated memory block referred to as a safe zone memory block and can be set aside specifically for handling memory failures. The safe zone memory block and can be included in or separate from the memory array 102. Alternatively, the another selected memory block 102n+m can be any suitable memory block 102a-102n-1 in the memory array 102. In one implementation, the write operation in operation 345 can be processed similar to operation 305 as described above, with regard to the newly selected memory block 102n+m. In an operation 350, the DATAn-1 is written from the second buffer 101B to WLn-1 of memory block 102n+m.

Figure 5A:
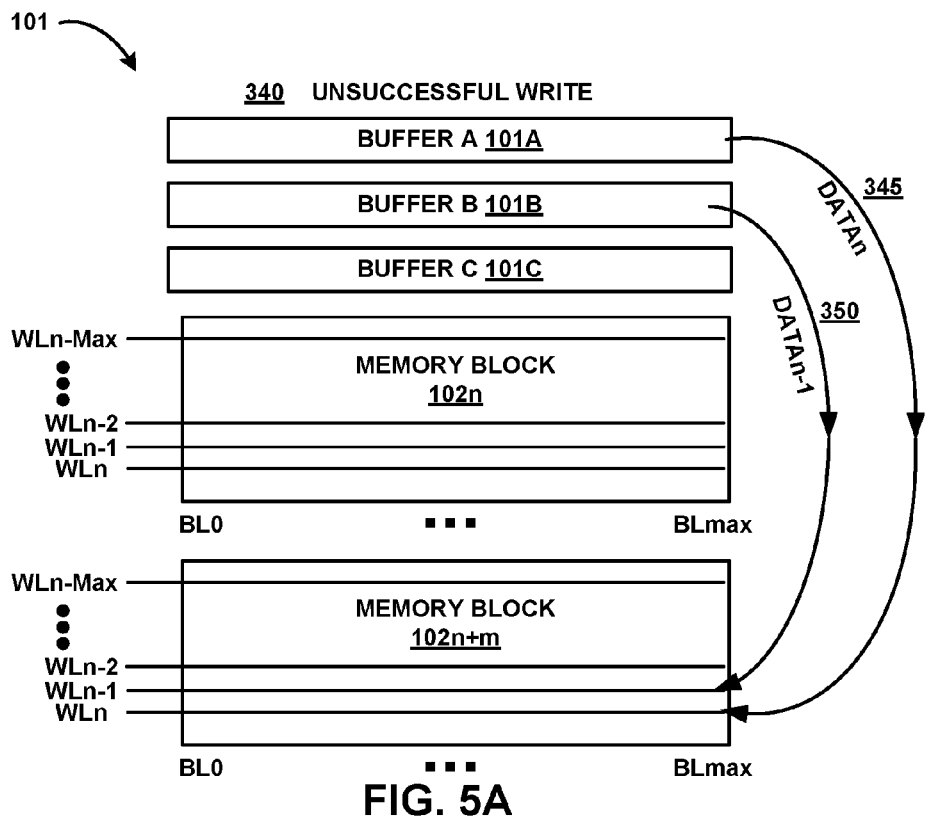
FIG. 5A illustrates the movement of DATAn in operation 345 and DATAn−1 in operation 350, for implementing embodiments of the present disclosure.

FIG. 5A illustrates the movement of DATAn in operation 345 and DATAn-1 in operation 350, for implementing embodiments of the present disclosure. The write operation in operation 335 was not successful and the user data DATAn is still maintained in the first buffer 101A until the user data DATAn is successfully stored in the memory array 102. Previously stored user data DATAn-1, if present, was copied to the second buffer 101B, as described above in FIG. 4A, before the write operation in operation 335. Due to the failed write operation 335, the previously stored data DATAn-1 is presumed to be corrupted when the unsuccessful write operation of user data DATAn was attempted. The user data DATAn-1 stored in the second buffer 101B is presumed to be an accurate copy of the previously stored user data DATAn-1 that was written to location WLn-1 in the selected memory block 102n as user data DATAn-1 was copied into the second buffer 101B before the user DATAn was stored in the adjacent location WLn.

The unsuccessful write operation 335 of user data DATAn indicates a defect or failure in the memory block 102n or at least the locations WLn and WLn-1 of memory block 102n. The unsuccessful write operation 335 of user data DATAn initiates a first data recovery process. The first data recovery process writes the user data DATAn in the first buffer 101A and the previously stored user data DATAn-1 in the second buffer 101B to respective memory locations WLn and WLn-1 in a new memory block 102n+m.

In an optional operation 355, the write failure can be reported to the host computer system 120 and/or the memory controller 110 and the method operations can end. The write failure indicates the memory block 102n suffering the write failure. The write failure can also indicate the wordlines WLn, WLn-1 associated with the detected failure. The memory controller 110 and/or host computer 120 can then identify the memory block 102n and/or wordlines WLn, WLn-1 as being damaged and unusable. The entire memory block 102n or at least the defective wordlines WLn, WLn-1 from the memory block can be prevented from being used in a future write operation.

If, in operation 340, the write operation was successful, the method operations continue in operation 360 where DATAn is written from the first buffer 101A to a third buffer 101C. In an operation 365, the DATAn' is read from WLn into the first buffer 101A.

Figure 5B:
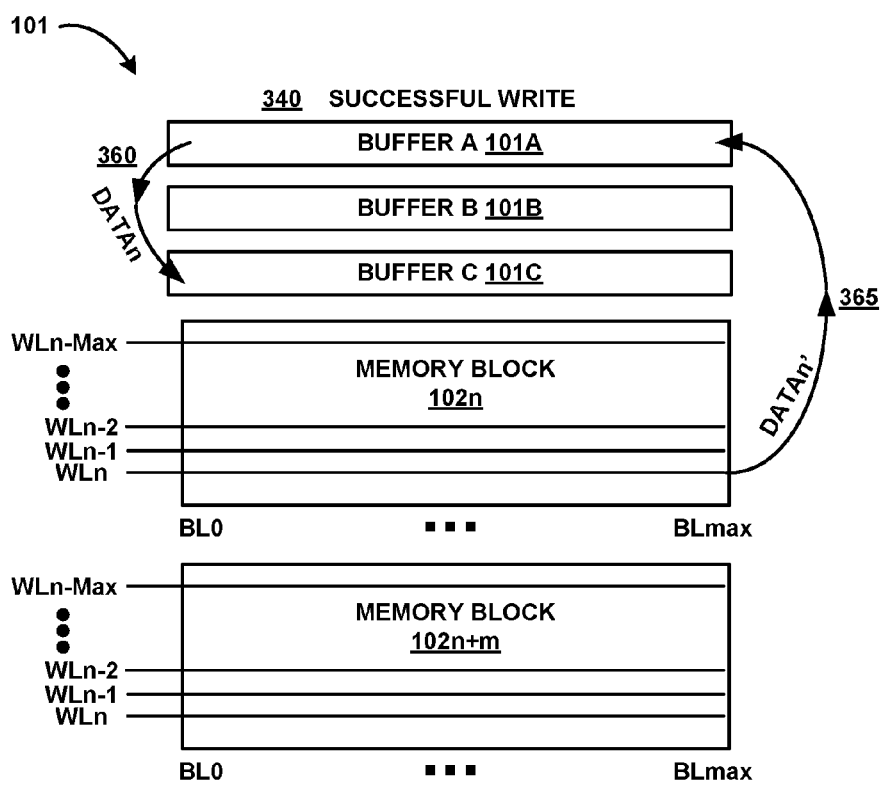
FIG. 5B illustrates the movement of DATAn in operation 360 and DATAn' in operation 365, for implementing embodiments of the present disclosure.

FIG. 5B illustrates the movement of DATAn in operation 360 and DATAn' in operation 365, for implementing embodiments of the present disclosure. The successful write operation 335 indicates user data DATAn was accurate written to the WLn of memory block 102n. The successful write operation 335 initiates a verification operation. The user data DATAn is moved from the first buffer 101A and into the third buffer 101C. The WLn of memory block 102n is read and data stored therein DATAn' is written into the first buffer 101A so the DATAn and DATAn' can be compared.

DATAn in the third buffer 101C is compared to DATAn' in the first buffer 101A to determine if a UECC error occurred, in an operation 370. If there are no errors in an operation 375, the method operations can end. If there are errors in operation 375, the method operations continue in operation 380.

In operation 380, the DATAn in the third buffer 101C is written to WLn of the other selected memory block such as memory block 102n+m. In an operation 385, the DATAn-1 is written from the second buffer 101B to WLn-1 of memory block 102n+m.

Figure 6:
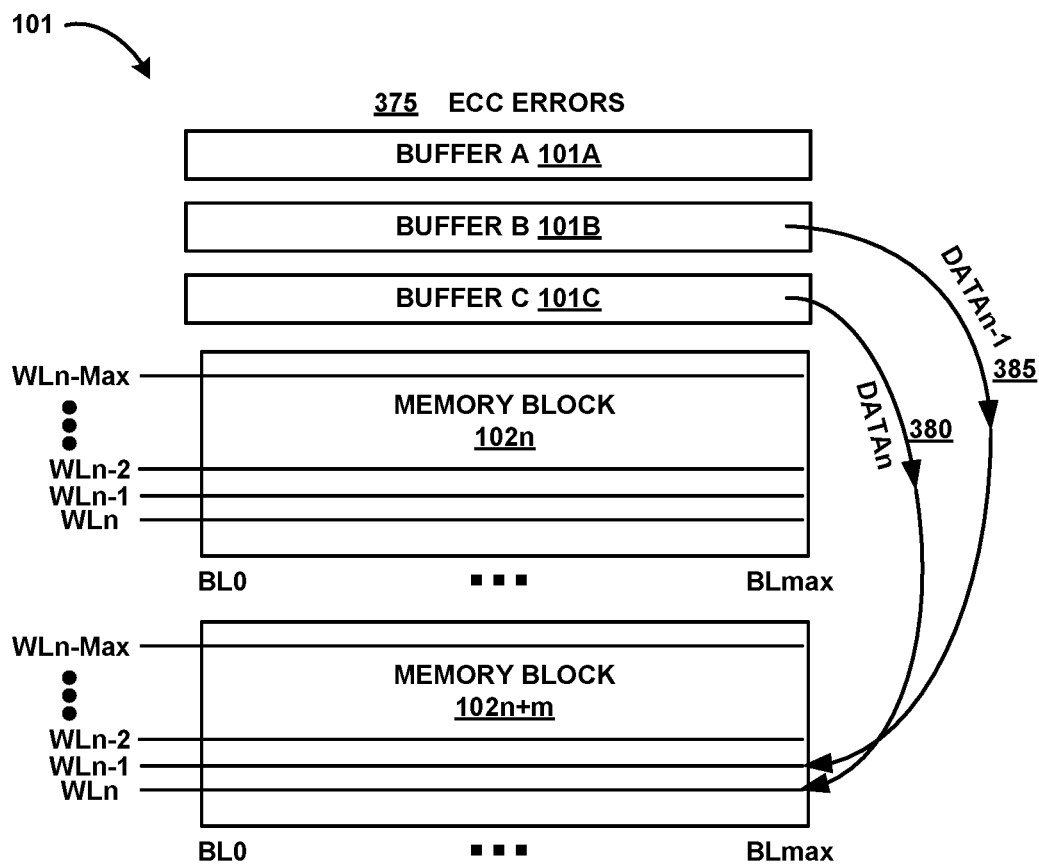
FIG. 6 illustrates the movement of DATAn in operation 380 and DATAn−1 in operation 385, for implementing embodiments of the present disclosure.

FIG. 6 illustrates the movement of DATAn in operation 380 and DATAn-1 in operation 385, for implementing embodiments of the present disclosure. The failed verification operation 370 and the user data DATAn is still maintained in the third buffer 101C until the user data DATAn is successfully stored in the memory array 102. Previously stored user data DATAn-1, if present, was copied to the second buffer 101B, as described above in FIG. 4A, before the write operation in operation 335.

Due to the failed verification operation 370, the previously stored data DATAn-1 is presumed to be corrupted when the unsuccessful write operation of user data DATAn was attempted. The user data DATAn-1 stored in the second buffer 101B is presumed to be an accurate copy of the previously stored user data DATAn-1 that was written to location WLn-1 in the selected memory block 102n as user data DATAn-1 was copied into the second buffer 101B before the user DATAn was stored in the adjacent location WLn.

The failed verification operation 370 of user data DATAn indicates a defect or failure in the memory block 102n or at least the locations WLn and WLn-1 of memory block 102n. The failed verification operation 370 of user data DATAn initiates a second data recovery process. The second data recovery process writes the user data DATAn in the third buffer 101C and the previously stored user data DATAn-1 in the second buffer 101B to respective memory locations WLn and WLn-1 in a new memory block 102n+m.

In an optional operation 390, the UECC error detected in operation 370 can be reported to the host computer system 120 and/or the memory controller 110, similar to the optional operation 355 above. Similar to operation 355, the host computer system 120 and/or the memory controller 110 can use the reported UECC error detection to identify failed memory block 102n and/or failed wordlines WLn, WLn-1. After operation 390, the method operations can end.

Figure 7:
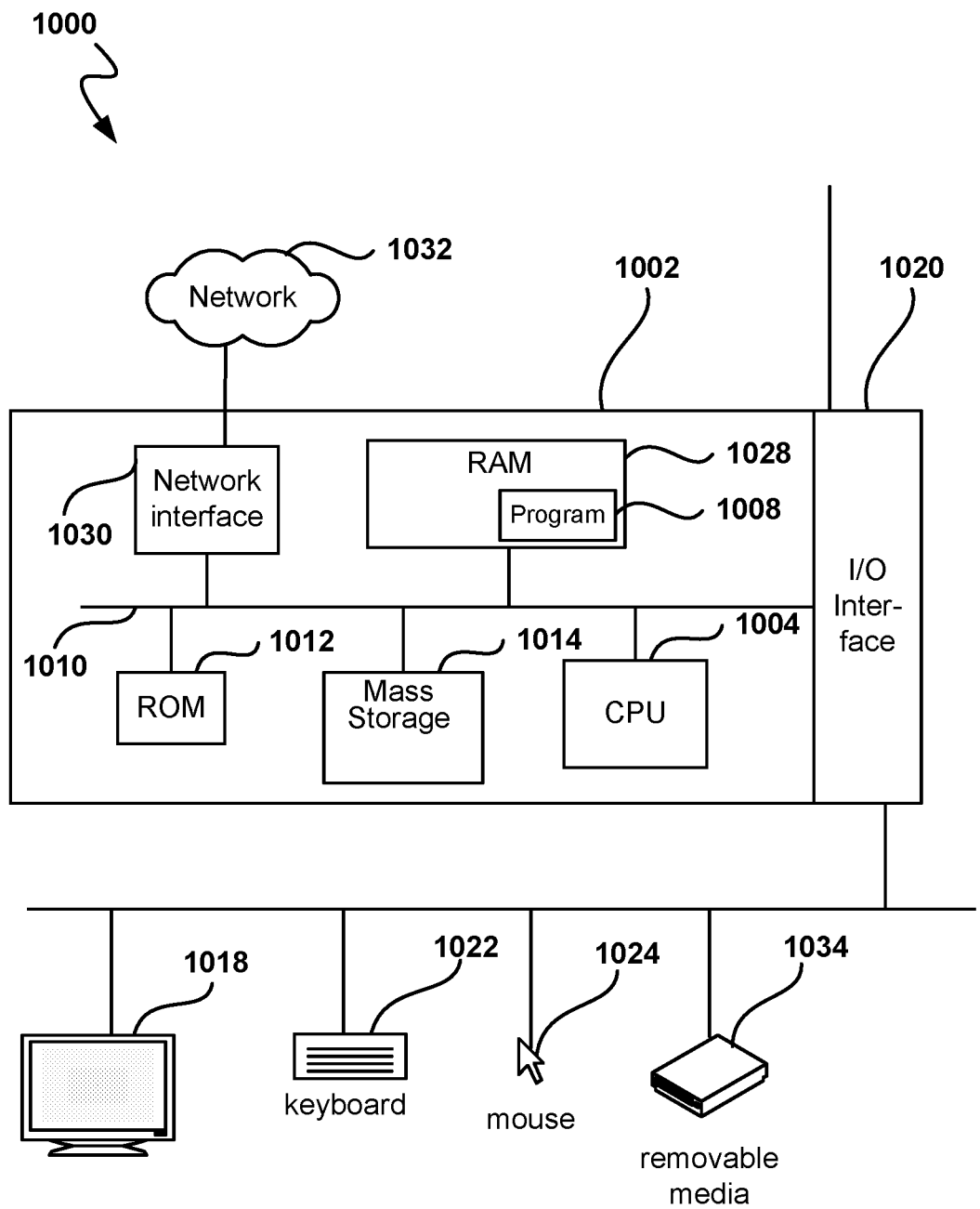
FIG. 7 is a block diagram of an example computer system, for implementing embodiments of the present disclosure.

FIG. 7 is a block diagram of an example computer system 1000, for implementing embodiments of the present disclosure. A general or specialized computer system, such as the computer system 1000, can be used as the host computer system 120 as described in FIG. 1, above and used for executing the operations for performing at least a portion of the analyses described above. The computer system 1000 includes a computer 1002, a display 1018, an optional printer or output device (not shown), a removable media (e.g., magnetic/optical/flash) drive 1034, a mass storage system 1014 (e.g., hard disk drive, solid state drive, or other suitable data storage device), a network interface 1030, and a keyboard 1022. Additional user interface devices such as a mouse 1024, a touch pad or touch screen can also be included.

The computer 1002 includes a central processing unit 1004, one or more data buses 1010, random access memory (RAM) 1028, read only memory (ROM) 1012, and an input/output interface 1020. The computer 1002 can be a personal computer (such as an IBM compatible personal computer, a Macintosh computer or Macintosh compatible computer), a workstation computer (such as a Sun Microsystems or Hewlett-Packard workstation), or some other suitable type of computer.

The CPU 1004 can be a general purpose digital processor or a specially designed processor. The CPU 1004 controls the operation of the computer system 1000. Using instructions retrieved from memory (e.g. program(s) 1008), the CPU 1004 controls the reception and manipulation of input data and the output and display of data on output devices.

The data buses 1010 are used by the CPU 1004 to access the RAM 1028, the ROM 1012 and the mass storage 1014. The RAM 1028 is used by the CPU 1004 as a general storage area and as scratch-pad memory, and can also be used to store input data and processed data. The RAM 1028 and the ROM 1012 can be used to store computer readable instructions or program code 1008 readable and executable by the CPU 1004 as well as other data.

The bus 1010 can also be used to access the input, output, and storage devices used by the computer 1002. These devices include the display 1018, the optional printer (not shown), the removable media drive 1034, and the network interface 1030. The input/output interface 1020 is used to receive input from keyboard 1022 and send decoded symbols for each pressed key to CPU 1004 over the data bus 1010.

The display 1018 is an output device that displays images of data provided by the CPU 1004 via the bus 1010 or provided by other components in the computer system 1000. The optional printer device, when operating as a printer, provides an image on a sheet of paper or a similar surface. Other output devices such as a plotter, projector, etc. can be used in place of, or in addition to, the printer device.

The removable media drive 1034 and the mass storage 1014 can be used to store various types of data. The removable media drive 1034 facilitates transporting such data to other computer systems, and mass storage 1014 permits fast access to large amounts of stored data. The mass storage 1014 may be included within the computer system or may be external to the computer system such as network attached storage or cloud storage accessible over one or more networks (e.g., local area networks, wide area networks, wireless networks, Internet 1032) or combinations of such storage devices and locations.

The CPU 1004 together with an operating system operate to execute computer readable code and logic and produce and use data. The computer code, logic and data may reside within the RAM 1028, the ROM 1012, or the mass storage 1014 or other media storage devices and combinations thereof. The computer code and data could also reside on a removable program medium and loaded or installed onto the computer system 1000 when needed. Removable program media include, for example, DVD, CD-ROM, PC-CARD, floppy disk, flash memory, optical media and magnetic disk or tape.

The network interface 1030 is used to send and receive data over a network 1032 connected to other computer systems. An interface card or similar device and appropriate software implemented by the CPU 1004 can be used to connect the computer system 1000 to an existing network and transfer data according to standard protocols such as local area networks, wide area networks, wireless networks, Internet and any other suitable networks and network protocols.

The keyboard 1022 is used by a user to input commands and other instructions to the computer system 1000. Other types of user input devices can also be used in conjunction with the present invention. For example, pointing devices such as a computer mouse, a track ball, a stylus, touch pad, touch screen or a tablet can be used to manipulate a pointer on a screen of a general-purpose computer.

It will be further appreciated that the instructions represented by the operations in the above figures are not required to be performed in the order illustrated, and that all the processing represented by the operations may not be necessary to practice the invention. It should also be appreciated that some operations may have sub-operations and in other instances, certain operations described herein may not be included in the illustrated operations. Further, the processes described in any of the above figures can also be implemented in software stored in any one of or combinations of the RAM, the ROM, or the hard disk drive.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, such as bit lines and word lines.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory planes. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three dimensional array the layers of each level of the array are formed on the layers of each underlying level of the array. One of skill in the art will understand that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

One of skill in the art will recognize that this invention is not limited to the two dimensional and three dimensional exemplary structures described but cover all relevant memory structures within the spirit and scope of the invention as described herein and as understood by one of skill in the art.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A memory system including:
   a memory operating system logic including:
      computer readable instructions on computer readable media for receiving a first quantity of user data to be stored in the memory system;
      computer readable instructions on computer readable media for writing the first quantity of user data to a first location of the memory system;
      computer readable instructions on computer readable media for writing the first quantity of user data from the first location to a first selected memory location within the memory system;

computer readable instructions on computer readable media for writing the first quantity of user data from the first location into a second location of the memory system when the first quantity of user data was successfully written to the first selected memory location; and computer readable instructions on computer readable media for confirming a quantity of stored data in the first location matches the first quantity of user data in the second location.

2. The system of claim 1, wherein the computer readable instructions on computer readable media for confirming the quantity of stored data in the first location matches the first quantity of user data in the second location, includes computer readable instructions on computer readable media for retrieving the quantity of stored data in the first selected memory location and writing the retrieved quantity of stored data into the first location.

3. The system of claim 1, further comprising:
computer readable instructions on computer readable media for writing the first quantity of user data from the first location into a second selected memory location in the memory system when the first quantity of user data was not successfully written to the first selected memory location; and
computer readable instructions on computer readable media for writing a second quantity of user data to a third selected memory location in the memory system when the second quantity of user data is stored in a third location of the memory system.

4. The system of claim 3, further comprising a dedicated error handling memory block in the memory system and wherein the second selected memory location is included in the dedicated error handling memory block.

5. The system of claim 1, further comprising a dedicated error handling memory block in the memory system.

6. The system of claim 1, further comprising a memory controller, wherein at least a portion of the memory operating system logic is included in the memory controller.

7. The system of claim 1, further comprising a memory array including a plurality of memory blocks of memory storage locations and at least a portion of the memory operating system logic is included in the memory array.

8. The system of claim 1, further comprising a memory array including a plurality of memory blocks of memory storage locations and at least a portion of a memory controller is included in the memory array.

9. The system of claim 1, further comprising a memory array including a plurality of memory blocks of memory storage locations and wherein the memory array includes a dedicated error handling memory block.

10. The system of claim 1, wherein the memory system is included in a computer system, the computer system including a processor coupled to the memory system by a data bus.

11. The system of claim 1, wherein at least a portion of the computer readable instructions on computer readable media are included in at least one integrated circuit.

12. A data storage system comprising:
a plurality of computer systems coupled by a data network, each one of the plurality of computer systems including:
a memory system coupled to a processor by a data bus; and
a memory operating system logic including:
computer readable instructions on computer readable media for receiving a first quantity of user data to be stored in the memory system;
computer readable instructions on computer readable media for writing the first quantity of user data to a first location of the memory system;
computer readable instructions on computer readable media for writing the first quantity of user data from the first location to a first selected memory location within the memory system;
computer readable instructions on computer readable media for writing the first quantity of user data from the first location into a second location of the memory system when the first quantity of user data was successfully written to the first selected memory location; and
computer readable instructions on computer readable media for confirming a quantity of stored data in the first location matches the first quantity of user data in the second location.

13. The system of claim 12, wherein the memory system includes a plurality of memory storage locations and the memory operating system logic is for operating the plurality of memory storage locations.

14. The system of claim 12, wherein the computer readable instructions on computer readable media for confirming the quantity of stored data in the first location matches the first quantity of user data in the second location, includes computer readable instructions on computer readable media for retrieving the quantity of stored data in the first selected memory location and writing the retrieved quantity of stored data into the first location.

15. The system of claim 12, further comprising:
computer readable instructions on computer readable media for writing the first quantity of user data from the first location into a second selected memory location in the memory system when the first quantity of user data was not successfully written to the first selected memory location; and
computer readable instructions on computer readable media for writing a second quantity of user data to a third selected memory location in the memory system when the second quantity of user data is stored in a third location of the memory system.

16. A mass data storage system comprising:
a plurality of memory storage locations; and
a memory operating system logic for storing data in the plurality of memory storage locations, the memory operating system logic including:
computer readable instructions on computer readable media for receiving a first quantity of user data to be stored in the memory system;
computer readable instructions on computer readable media for writing the first quantity of user data to a first location of the memory system;
computer readable instructions on computer readable media for writing the first quantity of user data from the first location to a first selected memory location within the memory system;
computer readable instructions on computer readable media for writing the first quantity of user data from the first location into a second location of the memory system when the first quantity of user data was successfully written to the first selected memory location; and
computer readable instructions on computer readable media for confirming a quantity of stored data in the first location matches the first quantity of user data in the second location.

17. The system of claim 16, wherein the mass data storage system is external from a computer system and coupled to the computer system via a network interface and a data network.

18. The system of claim 16, wherein the mass data storage system is external from a plurality of computer systems and coupled to each one of the plurality of computer systems via one or more data networks.

19. A system for managing a computer memory system comprising:
- a memory operating system logic for writing to and reading data from a plurality of memory storage locations in the computer memory system, wherein at least a portion of the memory operating system logic is implemented in an integrated circuit included in a portion of a memory controller for the computer memory system, the memory operating system logic including:
  - computer readable instructions on computer readable media for receiving a first quantity of user data to be stored in the memory system;
  - computer readable instructions on computer readable media for writing the first quantity of user data to a first location of the memory system;
  - computer readable instructions on computer readable media for writing the first quantity of user data from the first location to a first selected memory location within the memory system;
  - computer readable instructions on computer readable media for identifying a failure in the first selected memory location; and
  - computer readable instructions on computer readable media for identifying the first selected memory location as being unusable.

20. The system of claim 19, wherein the computer readable instructions on computer readable media for identifying the failure in the first selected memory location includes computer readable instructions on computer readable media for determining the first quantity of user data was not successfully written to the first selected memory location.

21. The system of claim 20, further comprising computer readable instructions on computer readable media for writing the first quantity of user data from the first location into a second selected memory location in the memory system when the first quantity of user data was not successfully written to the first selected memory location.

22. The system of claim 21 further comprising computer readable instructions on computer readable media for writing a second quantity of user data to a third selected memory location in the memory system when the second quantity of user data is stored in a third location of the memory system.

23. The system of claim 21, wherein the computer readable instructions on computer readable media for identifying the failure in the first selected memory location includes computer readable instructions on computer readable media for confirming a quantity of stored data in the first location matches the first quantity of user data in the second location.

* * * * *